United States Patent
Chang et al.

(10) Patent No.: US 7,374,654 B1
(45) Date of Patent: May 20, 2008

(54) METHOD OF MAKING AN ORGANIC MEMORY CELL

(75) Inventors: Mark S. Chang, Los Altos, CA (US); Sergey D. Lopatin, Santa Clara, CA (US); Ramkumar Subramanian, Sunnyvale, CA (US)

(73) Assignee: Spansion LLC, Sunnyvale, CA (US)

(*) Notice: Subject to any disclaimer, the term of this patent is extended or adjusted under 35 U.S.C. 154(b) by 647 days.

(21) Appl. No.: 10/978,845

(22) Filed: Nov. 1, 2004

(51) Int. Cl.
*C25F 3/00* (2006.01)
*C25F 7/00* (2006.01)
*C25D 5/18* (2006.01)
*C25D 5/10* (2006.01)
*B23H 7/00* (2006.01)

(52) U.S. Cl. ............ 205/674; 205/103; 205/170; 205/640

(58) Field of Classification Search ........... 205/674, 205/87, 103, 170, 640
See application file for complete search history.

(56) References Cited

U.S. PATENT DOCUMENTS

| | | | |
|---|---|---|---|
| 3,540,988 A * | 11/1970 | Wells et al. | 205/150 |
| 6,324,091 B1 * | 11/2001 | Gryko et al. | 365/151 |
| 6,656,763 B1 | 12/2003 | Oglesby et al. | |
| 6,686,263 B1 | 2/2004 | Lopatin et al. | |
| 6,746,971 B1 | 6/2004 | Ngo et al. | |
| 6,753,247 B1 | 6/2004 | Okoroanyanwu et al. | |
| 6,768,157 B2 | 7/2004 | Krieger et al. | |
| 6,770,905 B1 | 8/2004 | Buynoski et al. | |
| 6,773,954 B1 | 8/2004 | Subramanian et al. | |
| 6,781,868 B2 | 8/2004 | Bulovic et al. | |
| 6,787,458 B1 | 9/2004 | Tripsas et al. | |
| 6,803,267 B1 | 10/2004 | Subramanian et al. | |
| 7,148,144 B1 * | 12/2006 | Avanzino | 438/687 |
| 2003/0155602 A1 * | 8/2003 | Krieger et al. | 257/306 |

* cited by examiner

*Primary Examiner*—Alexa D. Neckel
*Assistant Examiner*—Zulmariam Mendez
(74) *Attorney, Agent, or Firm*—Amin, Turocy & Calvin, LLP (57) ABSTRACT

A method of making an organic memory cell which comprises two electrodes with a controllably conductive media between the two electrodes is disclosed. The present invention involves providing a dielectric layer having formed therein one or more first electrode pads; removing a portion of the first electrode pad to form a recessed area on top of the pads and in the dielectric layer using reverse electroplating; forming a controllably conductive media over the first electrode pad in the recessed area; and forming a second electrode over the conductive media. The controllably conductive media contains an organic semiconductor layer and a passive layer.

20 Claims, 4 Drawing Sheets

METHOD OF MAKING AN ORGANIC
MEMORY CELL

TECHNICAL FIELD

The present invention generally relates to making an organic memory cell. More particularly, the present invention relates making an organic memory cell involving removing a portion of an electrode pad to form a recessed area and forming the active portion of an organic memory cell in the recessed area.

BACKGROUND ART

The basic functions of a computer and memory devices include information processing and storage. In typical computer systems, these arithmetic, logic, and memory operations are performed by devices that are capable of reversibly switching between two states often referred to as "0" and "1." Such switching devices are fabricated from semiconducting devices that perform these various functions and are capable of switching between two states at high speed.

Electronic addressing or logic devices, for instance for storage or processing of data, are made with inorganic solid state technology, and particularly crystalline silicon devices. The metal oxide semiconductor field effect transistor (MOSFET) is one the main workhorses.

Much of the progress in making computers and memory devices faster, smaller and cheaper involves integration, squeezing ever more transistors and other electronic structures onto a postage stamp sized piece of silicon. A postage stamp sized piece of silicon may contain tens of millions of transistors, each transistor as small as a few hundred nanometers. However, silicon based devices are approaching their fundamental physical size limits.

Inorganic solid state devices are generally encumbered with a complex architecture which leads to high cost and a loss of data storage density. The circuitry of volatile semiconductor memories based on inorganic semiconductor material must constantly be supplied with electric current with a resulting heating and high electric power consumption in order to maintain stored information. Nonvolatile semiconductor devices have a reduced data rate and relatively high power consumption and large degree of complexity.

SUMMARY OF THE INVENTION

The following is a summary of the invention in order to provide a basic understanding of some aspects of the invention. This summary is not intended to identify key/critical elements of the invention or to delineate the scope of the invention. Its sole purpose is to present some concepts of the invention in a simplified form as a prelude to the more detailed description that is presented later.

The present invention provides upon processes for fabricating an organic memory cell. A method of making an organic memory cell in accordance with one aspect of the present invention includes providing a dielectric layer having formed therein one or more first electrode pads and removing a portion of the first electrode pad to form a recessed area on top of the pads and in the dielectric layer. After removing a portion of the electrode pad, a controllably conductive media is formed over the electrode pad and in the recessed area. The conductive media comprises an organic semiconductor material and a passive layer. Then a second electrode is formed over the conductive media.

Removing a portion of the first electrode pad to form a recessed area on top of the pad may be performed by reverse electroplating a portion of the first electrode pad. The method of the present invention facilitates subsequent processing and also simplifies the overall memory fabrication process, thus improving the throughput of organic memory devices.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DISCLOSURE OF THE INVENTION

The present invention involves providing a dielectric layer having formed therein one or more first electrode pads, removing a portion of the first electrode pad to form a recessed area using reverse electroplating on top of the pad and in the dielectric layer, forming a controllably conductive media comprising an organic semiconductor material and a passive layer over the electrode pad and in the recessed area, and providing a second electrode over the controllably conductive media. In this connection, the recessed memory cell is thus formed below the surface of the original pad. This feature greatly simplifies the manufacturing process and allows for immediate, subsequent metalization to connect all memory cells formed on a single substrate.

The organic memory cells may optionally contain additional layers, such as additional electrodes, charge retention layers, and/or chemically active layers between or in addition to the two electrodes and the controllably conductive media. The impedance of the controllably conductive media changes when an external stimulus such as an applied electric field is imposed. A plurality of organic memory cells, which may be referred to as an array, form an organic memory device.

The removal process may be performed by reverse electroplating a portion of the first electrode pad. For example, the dielectric layer having formed therein one or more electrode pads may be simply immersed in the reverse electroplating solution and processed. In the reverse electroplating process, the entire layer may be immersed in an electrolyte similar to an electrolyte used for plating. A metallic cathode is also immersed in the electrolyte. An electrical potential is imposed between the cathode and the pad, so that the pad is positive with respect to the cathode. Metal material is plated from the pad onto the cathode, thus removing the portion from the pad.

Figure 1:
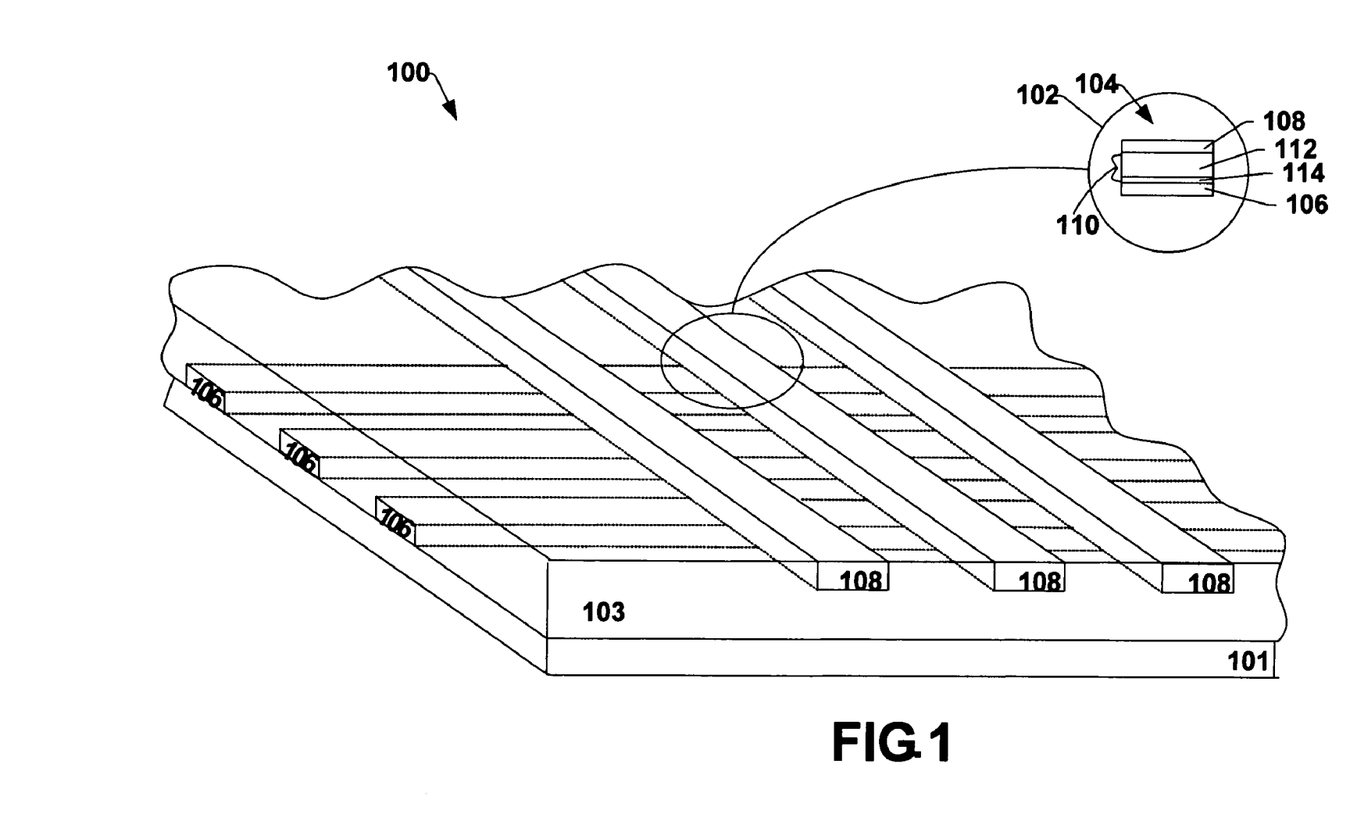
FIG. 1 illustrates a perspective view of a three dimensional microelectronic device containing a plurality of organic memory cells within a polymer dielectric in accordance with one aspect of the invention.

Referring to FIG. 1, a brief description of a microelectronic organic memory device 100 containing a plurality of organic memory cells in accordance with one aspect of the invention is shown, as well as an exploded view 102 of an exemplary organic memory cell 104. The microelectronic organic memory device 100 contains a desired number of organic memory cells, as determined by the number of rows, columns, and layers (three dimensional orientation described later) present. The first electrodes 106 and the second electrodes 108 are shown in substantially perpendicular orientation, although other orientations are possible to achieve the structure of the exploded view 102. Each organic memory cell 104 contains a first electrode 106 and a second electrode 108 with a controllably conductive media 110 therebetween. The controllably conductive media 110 contains an organic semiconductor layer 112 and passive layer 114. Peripheral circuitry and devices are not shown for brevity.

A portion of the first electrode pad which was formed in the dielectric layer is removed to form a recessed area on top of the pad and in the dielectric layer using reverse electroplating, and the controllably conductive media are formed in the recessed area over the electrode pad in the dielectric layer. The second electrode is formed over the conductive media, and the memory cell is thus formed below the original pad surface. Before the portion of electrode pad is removed, a resist such as a photoresist may be patterned optionally over the structure, the resist having openings corresponding with the subsequently formed memory cell region. When the resist is patterned over the structure, a portion of the electrode is removed in a manner so that the remaining patterned resist is not substantially deformed or degraded.

The removal process may be accomplished by reverse electroplating. Reverse electroplating is attractive since it does not require an etching solution and does not attack all exposed surfaces as chemical etching may. Choice of a suitable process and reagents of reverse electroplating depends primarily on the identity of the pad material, and to some extent, the composition of the dielectric layer. Conventional removal techniques of reverse electroplating may be used to create the recessed area on top of the pad. It is important to understand that each of the various reverse electroplating processes has its own set of features and characteristics well known in the art.

The reverse electroplating may work well for the removal process if the suitable electrolyte and process parameters are used. One skilled in the art of electroplating can select and choose the most appropriate electrolyte and process parameters of reverse electroplating techniques to remove the portion of the electrode pad. In one embodiment, phosphoric acid electrolytes may operate at temperatures from about 40 to about 80° C. with electrode potential from about 8 to about 12 V dc and current densities from about 60 to about 270 mA/cm$^2$. In another embodiment, nitric acid electrolytes may operate at temperatures from about 10 to about 35° C. with electrode potential from about 5 to about 8 V dc and current densities from about 400 to about 2,000 mA/cm$^2$. In another embodiment, organic acid electrolytes may operate at temperatures from about 20 to about 40° C. with electrode potential from about 15 to about 24 V dc and current densities from about 200 to about 1000 mA/cm$^2$.

In the reverse electroplating process, an electrode pad may be immersed in an electrolyte similar to an electrolyte used for plating. A metallic cathode is also immersed in the electrolyte. An electrical potential is imposed between the cathode and the pad, so that the pad is positive with respect to the cathode. Metal material is plated from the pad onto the cathode, thus removing a portion from the surface of the pad. The resist may be unnecessary to protect the dielectric layer because the dielectric layer is not removed by the reverse electroplating process. A patterned resist such as a photoresist, however, may be formed optionally over the structure, the patterned resist having openings corresponding with the subsequently formed memory cell region.

A suitable amount of the electrode pad is removed in order to form at least a portion of the active organic memory cell in the recessed area. In one embodiment, the depth of the recessed area is about 0.01 μm or more and about 25 μm or less. In another embodiment, the depth of the recessed area is about 0.05 μm or more and about 10 μm or less. In yet another embodiment, the depth of the recessed area is about 0.1 μm or more and about 3 μm or less. It is to be appreciated that the present invention is not limited to operating at the above depths of the recessed area. In many instances the above depths of the recessed area are employed, however, in some instances, smaller or larger depths are employed.

The organic memory cells contain at least two electrodes, as one or more electrodes may be disposed between the two electrodes that sandwich the controllably conductive media. The electrodes are made of conductive material, such as conductive metal, conductive metal alloys, conductive metal oxides, conductive polymer films, semiconductive materials, and the like. However, the first electrode pad is made of conductive material, a portion of which can be removed using reverse electroplating. Typically, the first electrode contains a conductive metal or a conductive metal alloy.

Examples of electrodes include one or more of aluminum, chromium, copper, germanium, gold, magnesium, manganese, indium, iron, nickel, palladium, platinum, silver, titanium, zinc, and alloys thereof; indium-tin oxide (ITO); polysilicon; doped amorphous silicon; metal silicides; and the like. Alloy electrodes specifically include Hastelloy®, Kovar®, Invar, Monel®, Inconel®, brass, stainless steel, magnesium-silver alloy, and various other alloys.

In one embodiment, the thickness of each electrode is independently about 0.01 μm or more and about 10 μm or less. In another embodiment, the thickness of each electrode is independently about 0.05 μm or more and about 5 μm or less. In yet another embodiment, the thickness of each electrode is independently about 0.1 μm or more and about 1 μm or less.

The controllably conductive media, disposed between the two electrodes, can be rendered conductive or non-conductive in a controllable manner using an external stimuli. Generally, in the absence of an external stimuli, the controllably conductive media is non-conductive or has a high impedance. Further, in some embodiments, multiple degrees of conductivity/resistivity may be established for the controllably conductive media in a controllable manner. For example, the multiple degrees of conductivity/resistivity for the controllably conductive media may include a non-conductive state, a highly conductive state, and a semiconductive state.

The controllably conductive media can be rendered conductive, non-conductive or any state therebetween (degree of conductivity) in a controllable manner by an external stimulus (external meaning originating from outside the controllably conductive media). For example, under an external electric field, radiation, and the like, a given non-conductive controllably conductive media is converted to a conductive controllably conductive media.

The controllably conductive media contains one or more organic semiconductor layers and one or more passive layers. In one embodiment, the controllably conductive media contains at least one organic semiconductor layer that is adjacent a passive layer (without any intermediary layers between the organic semiconductor layer and passive layer).

The organic semiconductor layer contains at least one of an organic polymer (such as a conjugated organic polymer), an organometallic compound (such as a conjugated organometallic compound), an organometallic polymer (such as a conjugated organometallic polymer), a buckyball, a carbon nanotube (such as a C6-C60 carbon nanotubes), and the like. Organic semiconductors thus have a carbon based structure, often a carbon-hydrogen based structure, which is different from conventional MOSFETs. The organic semiconductor materials are typically characterized in that they have overlapping p orbitals, and/or in that they have at least two stable oxidation states. The organic semiconductor materials are also characterized in that they may assume two or more resonant structures. The overlapping p orbitals contribute to the controllably conductive properties of the controllably conductive media. The amount of charge injected into the organic semiconductor layer also influences the degree of conductivity of the organic semiconductor layer.

A carbon nanotube is typically a hexagonal network of carbon atoms (from about 6 to about 60 carbon atoms, typically) that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single-wall nanotubes. A buckyball is more specifically a buckminster-fullerene, a soccerball-shaped 60-atom cluster of pure carbon.

The organic polymer typically contains a conjugated organic polymer. The polymer backbone of the conjugated organic polymer extends lengthwise between the electrodes (generally substantially perpendicular to the inner, facing surfaces of the electrodes). The conjugated organic polymer may be linear or branched, so long as the polymer retains its conjugated nature. Conjugated polymers are characterized in that they have overlapping p orbitals. Conjugated polymers are also characterized in that they may assume two or more resonant structures. The conjugated nature of the conjugated organic polymer contributes to the controllably conductive properties of the controllably conductive media.

In this connection, the organic semiconductor layer, such as the conjugated organic polymer, has the ability to donate and accept charges (holes and/or electrons). Generally, the organic semiconductor or an atom/moiety in the polymer has at least two relatively stable oxidation states. The two relatively stable oxidation states permit the organic semiconductor to donate and accept charges and electrically interact with the conductivity facilitating compound. The ability of the organic semiconductor layer to donate and accept charges and electrically interact with the passive layer also depends on the identity of the conductivity facilitating compound.

Organic semiconductors generally include polymers with variable electric conductivity. In one embodiment, the organic semiconductor contains a conjugated organic polymer. In another embodiment, the organic semiconductor contains a conjugated organic polymer with an aromatic group within its repeating unit. The polymer backbone of the conjugated organic polymer extends lengthwise between the electrodes. The conjugated organic polymer may be linear or branched, so long as the polymer retains its conjugated nature.

In yet another embodiment, the organic semiconductor contains an organometallic polymer (such as a conjugated organometallic polymer), or carbon structures such as carbon nanotubes and buckyballs. A carbon nanotube is typically a hexagonal network of carbon atoms that is rolled up into a seamless cylinder. Each end may be capped with half of a fullerene molecule. Carbon nanotubes may be prepared by the laser vaporization of a carbon target (a cobalt-nickel catalyst may facilitate growth) or a carbon-arc method to grow similar arrays of single wall nanotubes. A buckyball is more specifically a buckminster-fullerene, a soccerball shaped 60-atom or 70-atom cluster of pure carbon.

Examples of polymers with variable electrical conductivity include polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl)diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes (Fe, V, Cr, Co, Ni and the like); polypyridine metal complexes (Ru, Os and the like); and the like.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the organic semiconductor layer has a thickness of about 0.001 µm or more and about 5 µm or less. In another embodiment, the organic semiconductor layer has a thickness of about 0.01 µm or more and about 2.5 µm or less. In yet another embodiment, the organic semiconductor layer has a thickness of about 0.05 µm or more and about 1 µm or less.

In one embodiment, the organic semiconductor layer contains a thin layer designed to improve or lengthen charge retention time. The thin layer may be disposed anywhere within the organic semiconductor layer, but typically near the middle of the layer. The thin layer contains any of the electrode materials or the compounds of the below-described heterocyclic/aromatic compound layer. In one embodiment, the thin layer has a thickness of about 50 Å or more and about 0.1 µm or less. In another embodiment, the thin layer has a thickness of about 100 Å or more and about 0.05 µm or less. For example, an organic memory cell may contain a first electrode of copper, a passive layer of copper sulfide, an organic semiconductor layer of poly(phenylene vinylene), and a second electrode of aluminum, wherein the poly(phenylene vinylene) organic semiconductor layer contains a 250 Å thick layer of copper therein.

In one embodiment, the organic semiconductor material does not contain an organometallic compound. In another embodiment, the organic semiconductor material contains an organic polymer doped with an organometallic compound. In yet another embodiment, the organic memory cells optionally contain an organometallic compound layer. In still yet another embodiment, the organic semiconductor material contains an organometallic compound.

In one embodiment, the organic semiconductor layer is not doped with a salt. In another embodiment, the organic semiconductor layer is doped with a salt. A salt is an ionic compound having an anion and cation. General examples of salts that can be employed to dope the organic semiconductor layer include alkaline earth metal halogens, sulfates, persulfates, nitrates, phosphates, and the like; alkali metal halogens, sulfates, persulfates, nitrates, phosphates, and the like; transition metal halogens, sulfates, persulfates, nitrates, phosphates, and the like; ammonium halogens, sulfates, persulfates, nitrates, phosphates, and the like; quaternary alkyl ammonium halogens, sulfates, persulfates, nitrates, phosphates, and the like.

In one embodiment, the organic semiconductor layer has a thickness of about 0.001 µm or more and about 5 µm or less. In another embodiment, the organic semiconductor layer has a thickness of about 0.01 µm or more and about 2.5 µm or less. In yet another embodiment, the organic semiconductor layer has a thickness of about 0.05 µm or more and about 1 µm or less.

The organic semiconductor layer may be formed by spin-on techniques (depositing a mixture of the polymer/polymer precursor and a solvent, then removing the solvent from the substrate/electrode), by chemical vapor deposition (CVD) optionally including a gas reaction, gas phase deposition, and the like. CVD includes low pressure chemical vapor deposition (LPCVD), plasma enhanced chemical vapor deposition (PECVD), and high density chemical vapor deposition (HDCVD). During formation or deposition, the organic semiconductor material self assembles between the electrodes. It is not typically necessary to functionalize one or more ends of the organic polymer in order to attach it to an electrode/passive layer.

A covalent bond may be formed between the organic semiconductor material and the passive layer. Alternatively, close contact is required to provide good charge carrier/electron exchange between the organic semiconductor layer and the passive layer. The organic semiconductor layer and the passive layer are electrically coupled in that charge carrier/electron exchange occurs between the two layers.

A passive layer contains at least one conductivity facilitating compound that contributes to the controllably conductive properties of the controllably conductive media. The conductivity facilitating compound, formed by implantation, has the ability to donate and accept charges (holes and/or electrons) and/or act as a source of copper ions. The passive layer thus may transport holes, electrons, and/or ions between an electrode and the organic polymer layer/passive layer interface, facilitate charge/carrier injection into the organic polymer layer, and/or increase the concentration of a charge carrier (ions, holes and/or electrons) in the organic polymer layer. In some instances, the passive layer may store opposite charges thereby providing a balance of charges in the organic memory device as a whole. Storing charges/charge carriers is facilitated by the existence of two relatively stable oxidation states for the conductivity facilitating compound.

The fermi level of the passive layer is close to the valence band of the organic semiconductor layer. Consequently, the injected charge carrier (into the organic semiconductor layer) may recombine with the charge at the passive layer if the energy band of the charged organic semiconductor layer does not substantially change. Positioning energy bands involves compromising between ease of charge injection and length of charge (data) retention time.

The applied external field can reduce the energy barrier between the passive layer and organic layer depending on the field direction. Therefore, enhanced charge injection in the forward direction field in programming operation and also enhanced charge recombination in reversed field in erase operation can be obtained.

The passive layer may in some instances act as a catalyst when forming the organic semiconductor layer, particularly when the organic semiconductor layer contains a conjugated organic polymer. In this connection, the polymer backbone of the conjugated organic polymer may initially form adjacent the passive layer, and grow or assemble away and substantially perpendicular to the passive layer surface. As a result, the polymer backbones of the organic polymers may be self aligned in a direction that traverses the electrodes or in a direction away from the passive layer.

Examples of conductivity facilitating compounds that may constitute the passive layer include one or more of copper sulfide ($Cu_2S$, $CuS$), copper rich copper sulfide ($Cu_3S$, $CuS$; $Cu_3S$, $CU_2S$,), copper oxide ($CuO$, $Cu_2O$), copper selenide ($Cu_2Se$, $CuSe$), copper telluride ($Cu_2Te$, $CuTe$), manganese oxide ($MnO_2$), titanium dioxide ($TiO_2$), indium oxide ($I_3O_4$), silver sulfide ($Ag_2S$, $AgS$), gold sulfide ($Au_2S$, $AuS$), iron oxide ($Fe_3O_4$), cobalt arsenide ($CoAs_2$), nickel arsenide ($NiAs$), and the like. The conductivity facilitating compounds do not necessarily dissociate into ions under the strength of the electric field, although ions may move through them. The passive layer may contain two or more subpassive layers, each sublayer containing the same, different, or multiple conductivity facilitating compounds.

The passive layer is grown using oxidation techniques, formed via gas phase reactions, implantation techniques, or deposited on/between electrodes. In some instances, to promote long charge retention times (in the organic semiconductor layer), the passive layer may be treated with a plasma after it is formed. The plasma treatment modifies the energy barrier of the passive layer.

In one embodiment, the passive layer containing the conductivity facilitating compound has a thickness of about 2 Å or more and about 0.1 µm or less. In another embodiment, the passive layer has a thickness of about 10 Å or more and about 0.01 µm or less. In yet another embodiment, the passive layer has a thickness of about 50 Å or more and about 0.005 µm or less.

In order to facilitate operation of the organic memory cells, the organic semiconductor layer is thicker than the passive layer. In one embodiment, the thickness of the organic semiconductor layer is from about 10 to about 500 times greater than the thickness of the passive layer. In another embodiment, the thickness of the organic semiconductor layer is from about 25 to about 250 times greater than the thickness of the passive layer.

In one embodiment, the organic memory cells optionally contain a heterocyclic/aromatic compound layer. In another embodiment, the organic semiconductor layer is doped with a heterocyclic/aromatic compound. If present, the heterocyclic/aromatic compound layer has a thickness of about 0.001 µm or more and about 1 µm or less.

The area size of the individual organic memory cells (as measured by the surface area of the two electrodes directly overlapping each other) can be small compared to conventional silicon based inorganic memory cells such as metal oxide semiconductor field effect transistors (MOSFETs). In one embodiment, the area size of the organic memory cells of the present invention is about 0.0001 µm$^2$ or more and about 4 µm$^2$ or less. In another embodiment, the area size of the organic memory cells is about 0.001 µm$^2$ or more and about 1 µm$^2$ or less.

Operation of the organic memory devices/cells is facilitated using an external stimuli to achieve a switching effect. The external stimuli include an external electric field and/or light radiation. Under various conditions, the organic memory cell is either conductive (low impedance or "on" state) or non-conductive (high impedance or "off" state).

The organic memory cell may further have more than one conductive or low impedance state, such as a very highly conductive state (very low impedance state), a highly conductive state (low impedance state), a conductive state (medium level impedance state), and a non-conductive state (high impedance state) thereby enabling the storage of multiple bits of information in a single organic memory cell, such as 2 or more bits of information or 4 or more bits of information.

Switching the organic memory cell to the "on" state from the "off" state occurs when an external stimuli such as an applied electric field exceeds a threshold value. Switching the organic memory cell to the "off" state from the "on" state occurs when an external stimuli does not exceed a threshold value or does not exist. The threshold value varies depending upon a number of factor including the identity of the materials that constitute the organic memory cell and the passive layer, the thickness of the various layers, and the like.

Generally speaking, the presence of an external stimuli such as an applied electric field that exceeds a threshold value ("on" state) permits an applied voltage to write or erase information into/from the organic memory cell and the presence of an external stimuli such as an applied electric field that is less than a threshold value permits an applied voltage to read information from the organic memory cell; whereas the absence of the external stimuli that exceeds a threshold value ("off" state) prevents an applied voltage to write or erase information into/from the organic memory cell.

To write information into the organic memory cell, a voltage or pulse signal that exceeds the threshold is applied. To read information written into the organic memory cell, a voltage or electric field of any polarity is applied. Measuring the impedance determines whether the organic memory cell is in a low impedance state or a high impedance state (and thus whether it is "on" or "off"). To erase information written into the organic memory cell, a negative voltage or a polarity opposite the polarity of the writing signal that exceeds a threshold value is applied.

The organic memory devices described herein can be employed to form logic devices such as central processing units (CPUs); volatile memory devices such as DRAM devices, SRAM devices, and the like; input/output devices (I/O chips); and non-volatile memory devices such as EEPROMs, EPROMs, PROMs, and the like. The organic memory devices may be fabricated in planar orientation (two dimensional) or three dimensional orientation containing at least two planar arrays of the organic memory cells.

Figure 2:
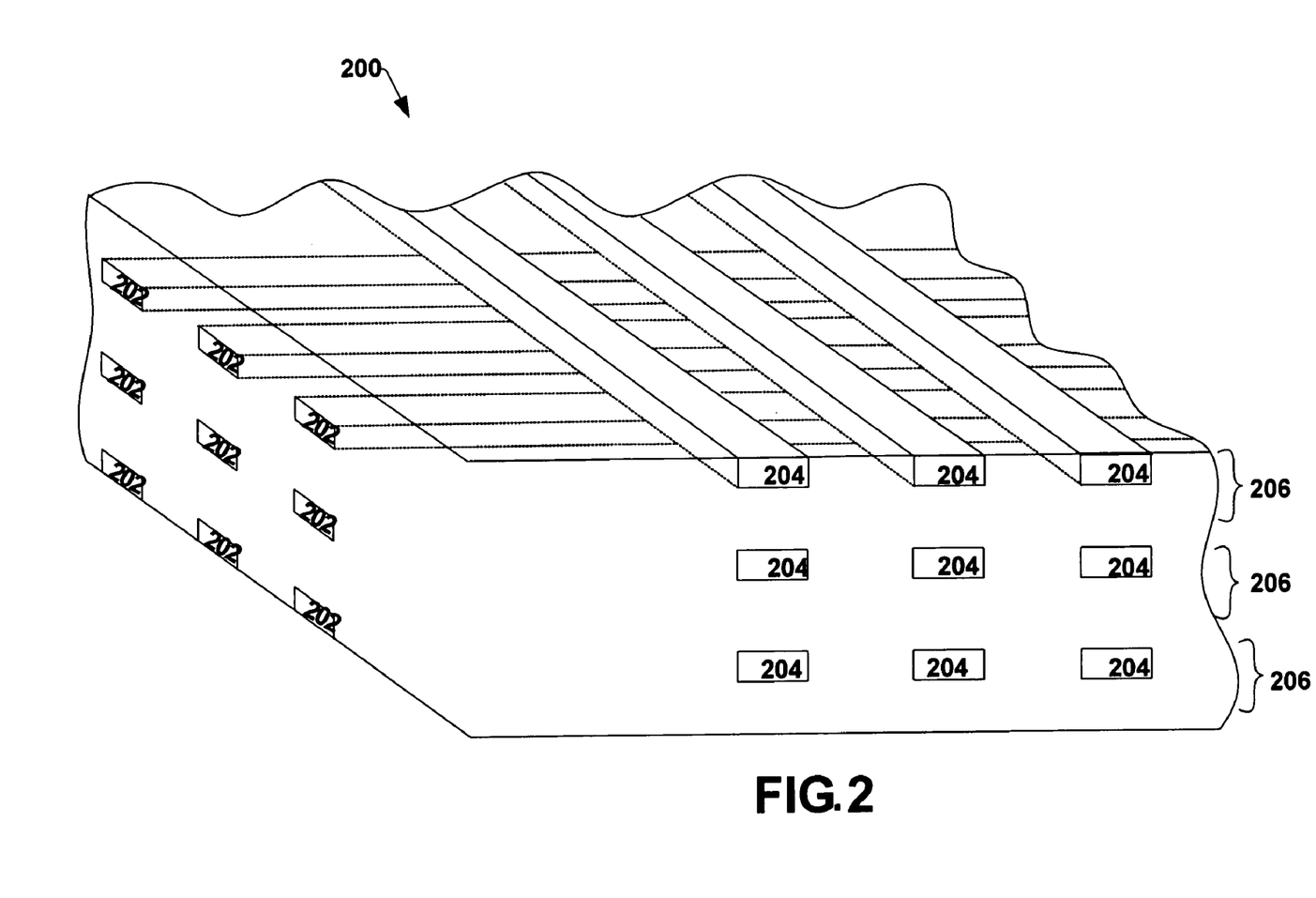
FIG. 2 illustrates a perspective view of a three dimensional microelectronic device containing a plurality of organic memory cells within a polymer dielectric in accordance with another aspect of the invention.

Referring to FIG. 2, a three dimensional microelectronic organic memory device 200 containing a plurality of organic memory cells in accordance with an aspect of the invention is shown. The three dimensional microelectronic organic memory device 200 contains a plurality of first electrodes 202, a plurality of second electrodes 204, and a plurality of memory cell layers 206. Between the respective first and second electrodes are the controllably conductive media (not shown). The plurality of first electrodes 202 and the plurality of second electrodes 204 are shown in substantially perpendicular orientation, although other orientations are possible. The three dimensional microelectronic organic memory device is capable of containing an extremely high number of memory cells thereby improving device density. Peripheral circuitry and devices are not shown for brevity.

Figure 3:
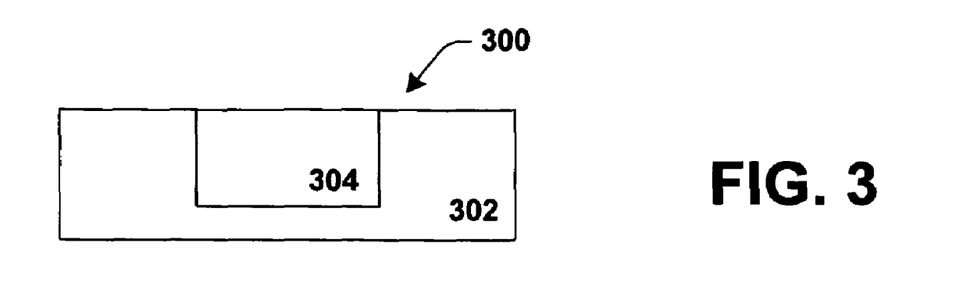
FIG. 3 illustrates a cross sectional view of a method of forming an organic memory cell in accordance with one aspect of the invention.

Referring to FIGS. 3 to 6 and FIGS. 7 to 11, two of many possible exemplary embodiments of method of making a memory cell are illustrated. Referring to FIG. 3, a structure 300 containing a layer 302 and a first electrode pad 304 is provided. The layer 302 may be a layer of a dielectric. In one embodiment, the electrode pad 304 contains copper or a copper alloy.

Figure 4:
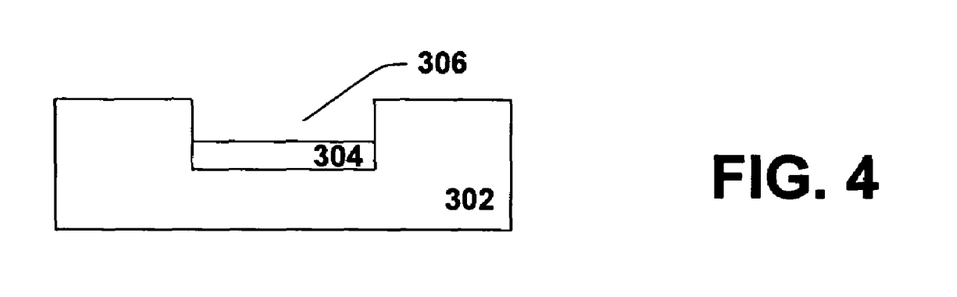
FIG. 4 illustrates a cross sectional view of a method of forming an organic memory cell in accordance with one aspect of the invention.

Referring to FIG. 4, a portion of the electrode pad 304 of a recessed area 306 is removed to form the recessed area 306 on top of the pad 304 in the layer 302. The removal process may be performed by reverse electroplating. In the reverse electroplating process, the structure 300 is immersed in an electrolyte similar to an electrolyte used for plating. One preferred embodiment of the present invention uses copper electrodes. The reverse electroplating process is effectively the reverse of the electroplating reaction and is often carried out using the same or similar reactors as electroplating. A direct current electric field may be used to remove metal particles off the pad and dissolve them in the electrolyte (typically phosphoric acid-, nitric acid-, or organic acid-based). A metallic cathode is also immersed in the electrolyte. An electrical potential is imposed between the cathode and the pad, so that the pad is positive with respect to the cathode. Metal material is plated from the pad onto the cathode, thus removing the portion from the surface of the pad. In one embodiment, when the electrode pad 304 contains copper or a copper alloy, phosphoric acid electrolytes may operate at temperatures about 60° C. with electrode potential about 10 V dc and current densities about 160 mA/cm². In one embodiment, the depth of the recessed area 306 is about 1.0 µm.

Figure 5:
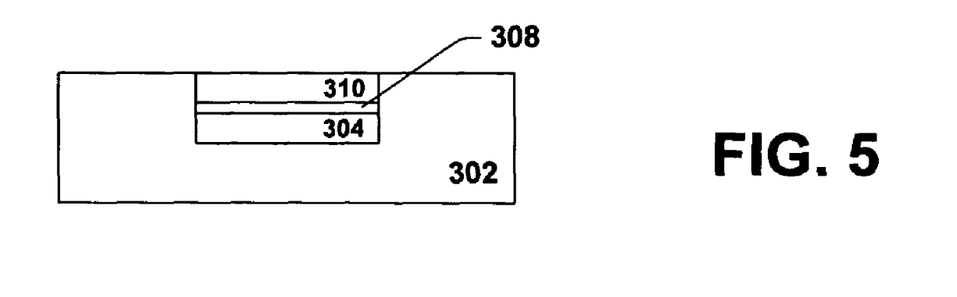
FIG. 5 illustrates a cross sectional view of a method of forming an organic memory cell in accordance with one aspect of the invention.

Referring to FIG. 5, a passive layer 308 may be formed over the first electrode pad 304 in the recessed area 306. In one embodiment, the copper sulfide passive layer 308 may be formed using a gas treatment, in which a sulfide compound (for example, hydrogen sulfide, lithium sulfide, sodium sulfide, potassium sulfide) is contacted with the copper structure for a time and at a temperature sufficient to facilitate formation of copper sulfide, for example for a time from about 1 second to about 3 minutes at a temperature from about 150° C. to about 500° C. In one embodiment, the passive layer has a thickness of about 250 Å.

An organic semiconductor layer 310 containing an organic semiconductor such as polyphenylacetylene is formed over the passive layer 308 using conventional CVD techniques.

Figure 6:
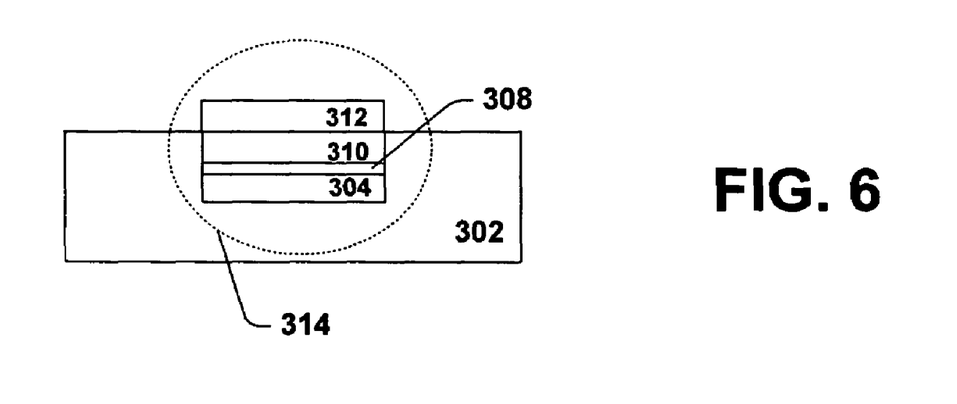
FIG. 6 illustrates a cross sectional view of a method of forming an organic memory cell in accordance with one aspect of the invention.

Referring to FIG. 6, another electrode 312 is formed over the organic semiconductor layer 310 to provide organic memory cell 314. In one embodiment, the second electrode 312 contains copper or a copper alloy. In another embodiment, the second electrode 312 may be formed in the recessed area 306 in the layer 302 (not shown).

Figure 7:
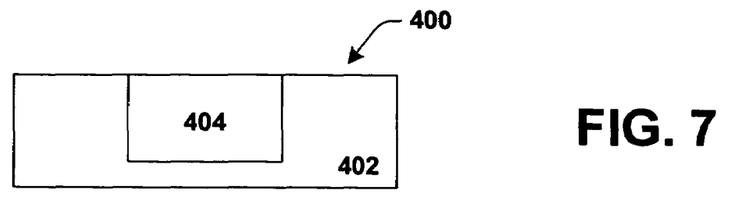
FIG. 7 illustrates a cross sectional view of a method of forming an organic memory cell in accordance with one aspect of the invention.

Referring to FIG. 7, a structure 400 containing a layer 402 and an electrode pad 404 is provided. The layer 402 may be a layer of a dielectric. In one embodiment, the electrode pad 404 contains copper or a copper alloy.

Figure 8:
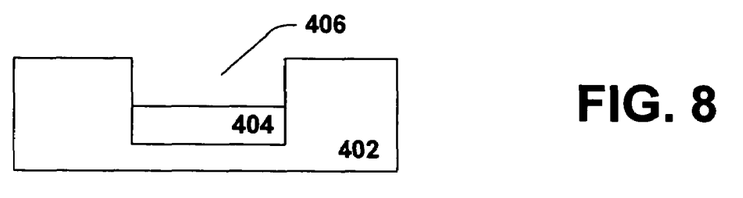
FIG. 8 illustrates a cross sectional view of a method of forming an organic memory cell in accordance with one aspect of the invention.

Referring to FIG. 8, a portion of the electrode pad 404 of a recessed area 406 is removed to form the recessed area 406 on top of the pad 404. The removal process may be performed by reverse electroplating. In the reverse electroplating process, the structure 400 may be immersed in an electrolyte similar to an electrolyte used for plating. In one embodiment, when electrode pad includes copper, nickel, gold, platinum, nickel-iron, etc, an electrolyte (ammonium tripolyphosphate 1200 g/L and boric acid 50 g/L) may operate at pH 7.5 (adjust pH with boric acid or ammonia hydroxide) with current density of about 30 A/m². In another embodiment, an electrolyte (ammonium phosphate 150 g/L and citric acid 150 g/L) may operate at pH 9 (adjust pH with phosphoric acid or ammonia hydroxide) with current density of about 15 A/m².

Figure 9:
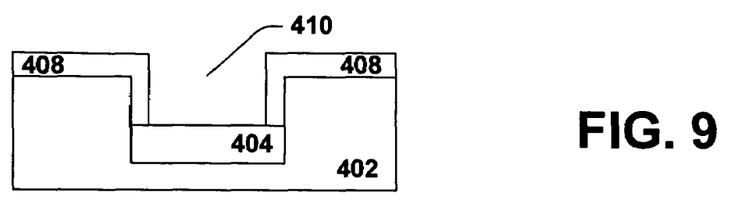
FIG. 9 illustrates a cross sectional view of a method of forming an organic memory cell in accordance with one aspect of the invention.

Referring to FIG. 9, after the opening 406 is formed, a patterned resist 408 may be formed optionally over the structure 400, the patterned resist 408 having openings 410 corresponding with the subsequently formed passive regions.

Figure 10:
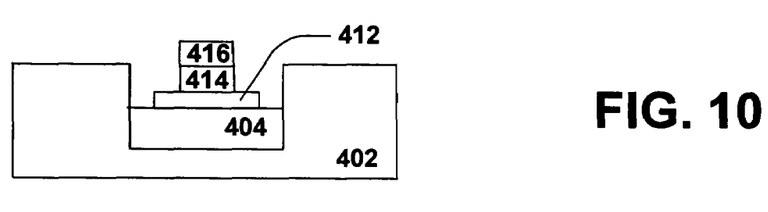
FIG. 10 illustrates a cross sectional view of a method of forming an organic memory cell in accordance with one aspect of the invention.

Referring to FIG. 10, a passive layer 412 may be formed over the electrode pad 404 in the recessed area. In one embodiment, the copper sulfide passive layer 412 may be formed using a gas treatment, in which a sulfide compound (for example, hydrogen sulfide, lithium sulfide, sodium sulfide, potassium sulfide) is contacted with the copper structure for a time and at a temperature sufficient to facilitate formation of copper sulfide, for example for a time from about 1 second to about 3 minutes at a temperature from about 150° C. to about 500° C.

An organic semiconductor layer 414 containing an organic semiconductor such as polyphenylacetylene is formed over the passive layer 412 in the recessed area using CVD techniques. Then another electrode 416 is formed over the organic semiconductor layer 414. In one embodiment, the electrode 416 may contain copper or a copper alloy. In another embodiment, the second electrode 416 may be formed in the recessed area 406 in the layer 402 (not shown).

Figure 11:
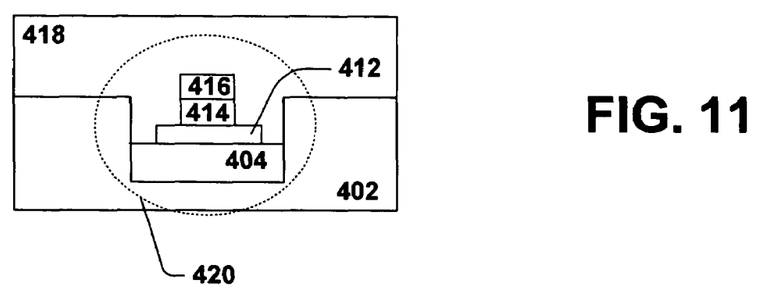
FIG. 11 illustrates a cross sectional view of a method of forming an organic memory cell in accordance with one aspect of the invention.

Referring to FIG. 11, a dielectric encasement layer 418 is formed over the structure 400. Consequently, organic memory cell 420 is provided.

The organic memory cells/devices are useful in any device requiring memory. For example, the organic memory devices are useful in computers, appliances, industrial equipment, hand-held devices, telecommunications equipment, medical equipment, research and development equipment, transportation vehicles, radar/satellite devices, and the like. Hand-held devices, and particularly hand-held electronic devices, achieve improvements in portability due to the small size and light weight of the organic memory devices. Examples of hand-held devices include cell phones and other two way communication devices, personal data assistants, palm pilots, pagers, notebook computers, remote controls, recorders (video and audio), radios, small televisions and web viewers, cameras, and the like.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including any reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of making an organic memory cell comprising:
    providing a dielectric layer having formed therein one or more first electrode pads;
    removing a portion of the first electrode pad to form a recessed area on top of the first electrode pad and in the dielectric layer using reverse electroplating;
    forming a controllably conductive media comprising an organic semiconductor material and a passive layer over the electrode pad and in the recessed area; and
    providing a second electrode over the controllably conductive media.

2. The method of claim 1, wherein the reverse electroplating is performed using phosphoric acid electrolytes, nitric acid electrolytes, or organic acid electrolytes.

3. The method of claim 1, further comprising forming a mask over portions of the dielectric layer before removing the portion of the first electrode pad.

4. The method of claim 1, further comprising forming a mask over portions of the dielectric layer after removing the portion of the first electrode pad.

5. The method of claim 1, wherein the recessed area on top of the first electrode pads in the dielectric layer has a depth of about 0.01 µm or more and about 25 µm or less.

6. The method of claim 1, wherein the organic semiconductor material comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t- butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene; poly(trimethylsilyl)pheylacetylene; polydipyrrylmethane; polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

7. The method of claim 1, wherein the first electrode and second electrode independently comprise at least one selected from the group consisting of aluminum, chromium, copper, germanium, gold, magnesium, manganese, indium, iron, nickel, palladium, platinum, silver, titanium, zinc, and alloys thereof; indium-tin oxide; and metal silicides.

8. The method of claim 1, wherein the organic semiconductor layer has a thickness of about 0.001 µm or more and about 5 µm or less and the passive layer has a thickness of about 2 Å or more and about 0.1 µm or less.

9. The method of claim 1, wherein the second electrode is formed in the recessed area in the dielectric layer.

10. A method of making an organic memory cell comprising:
    providing a dielectric layer having formed therein one or more first electrode pads, at least one of the first electrode pads comprising at least copper;
    removing a portion of the pad to form a recessed area on top of the first electrode pad and in the dielectric layer using reverse electroplating;
    forming a copper sulfide region over the first electrode pad and in the recessed area;
    forming an organic semiconductor layer over the copper sulfide region in the recessed area, the organic semiconductor layer comprising at least one of a conjugated organic polymer, a conjugated organometallic compound, a conjugated organometallic polymer, a buckyball, and a carbon nanotube; and
    forming a second electrode over the organic semiconductor layer.

11. The method of claim 10, wherein forming a copper sulfide region is performed by contacting a sulfide compound with the first electrode.

12. The method of claim 11, wherein the sulfide compound is contacted with the first electrode for a time from about 1 second to about 3 minutes at a temperature from about 150° C. to about 500° C.

13. The method of claim 10, wherein the reverse electroplating is performed using phosphoric acid electrolytes, nitric acid electrolytes, or organic acid electrolytes.

14. The method of claim 10, further comprising forming a mask over portions of the dielectric layer before removing the portion of the first electrode pad.

15. The method of claim 10, further comprising forming a mask over portions of the dielectric layer after removing the portion of the first electrode pad.

16. The method of claim 10, wherein the recessed area on top of the first electrode pads in the dielectric layer has a depth of about 0.01 µm or more and about 25 µm or less.

17. The method of claim 10, wherein the organic semiconductor layer comprises at least one selected from the group consisting of polyacetylene; polydiphenylacetylene; poly(t-butyl)diphenylacetylene; poly(trifluoromethyl)diphenylacetylene; polybis(trifluoromethyl)acetylene; polybis(t-butyldiphenyl)acetylene; poly(trimethylsilyl) diphenylacetylene; poly(carbazole)diphenylacetylene; polydiacetylene; polyphenylacetylene; polypyridineacetylene; polymethoxyphenylacetylene; polymethylphenylacetylene; poly(t-butyl)phenylacetylene; polynitro-phenylacetylene; poly(trifluoromethyl)phenylacetylene;

poly(trimethylsilyl)pheylacetylene; polydipyrrylmethane;

polyindoqiunone; polydihydroxyindole; polytrihydroxyindole; furane-polydihydroxyindole; polyindoqiunone-2-carboxyl; polyindoqiunone; polybenzobisthiazole; poly(p-phenylene sulfide); polyaniline; polythiophene; polypyrrole; polysilane; polystyrene; polyfuran; polyindole; polyazulene; polyphenylene; polypyridine; polybipyridine; polyphthalocyanine; polysexithiofene; poly(siliconoxohemiporphyrazine); poly(germaniumoxohemiporphyrazine); poly(ethylenedioxythiophene); polymetallocene complexes; and polypyridine metal complexes.

18. The method of claim 10, wherein the second electrode and second electrode independently comprise at least one selected from the group consisting of aluminum, chromium, copper, germanium, gold, magnesium, manganese, indium, iron, nickel, palladium, platinum, silver, titanium, zinc, and alloys thereof; indium-tin oxide; and metal silicides.

19. The method of claim 10, wherein the organic semiconductor layer has a thickness of about 0.001 µm or more and about 5 µm or less and the passive layer has a thickness of about 2 Å or more and about 0.1 µm or less.

20. The method of claim 10, wherein the second electrode is formed in the recessed area in the dielectric layer.

* * * * *